United States Patent [19]

Osawa et al.

[11] Patent Number: 5,769,521
[45] Date of Patent: Jun. 23, 1998

[54] LIGHT SOURCE DEVICE AND METHOD OF PRODUCING SAME

[75] Inventors: Hideharu Osawa; Kazuyoshi Tsuji, both of Kyoto, Japan

[73] Assignee: Rohm Co., Ltd., Kyoto, Japan

[21] Appl. No.: 824,204

[22] Filed: Mar. 25, 1997

[30]     Foreign Application Priority Data

May 2, 1996 [JP] Japan ................................ 8-111467

[51] Int. Cl.⁶ ......................... G01D 11/28; F21V 7/04; H01R 33/00
[52] U.S. Cl. ........................... 362/27; 362/26; 362/31; 362/226
[58] Field of Search .................. 362/26, 27, 31, 362/800, 226, 249

[56]           References Cited

U.S. PATENT DOCUMENTS 4,897,769  1/1990  Lang .................................... 362/226
4,935,665  6/1990  Murata ............................... 362/800 X
4,975,808  12/1990  Bond et al. ............................. 362/31
5,075,824  12/1991  Tan ........................................ 362/31
5,537,296  7/1996  Kimura et al. .......................... 362/31
5,550,715  8/1996  Hawkins ................................. 362/31
5,613,751  3/1997  Parker et al. ........................... 362/31
5,618,096  4/1997  Parker et al. ........................... 362/31

*Primary Examiner*—Ira S. Lazarus
*Assistant Examiner*—Nhat-Hang H. Lam
*Attorney, Agent, or Firm*—Keiichi Nishimura

[57]           ABSTRACT

A light source device has an elongated rectangular boxed-shaped reflective case with a bottom wall, frame walls which protrude forward from this bottom wall to form an open front surface. A plurality of terminal plates are disposed on the bottom part of this reflective case, and LED chips are bonded onto these terminal plates. Lead terminals extend from the terminal plates and penetrate and reach the outer surface of one of the frame walls. Thickened parts with increased thickness are formed on the inner surface of the frame walls at positions corresponding to these lead terminals.

9 Claims, 10 Drawing Sheets

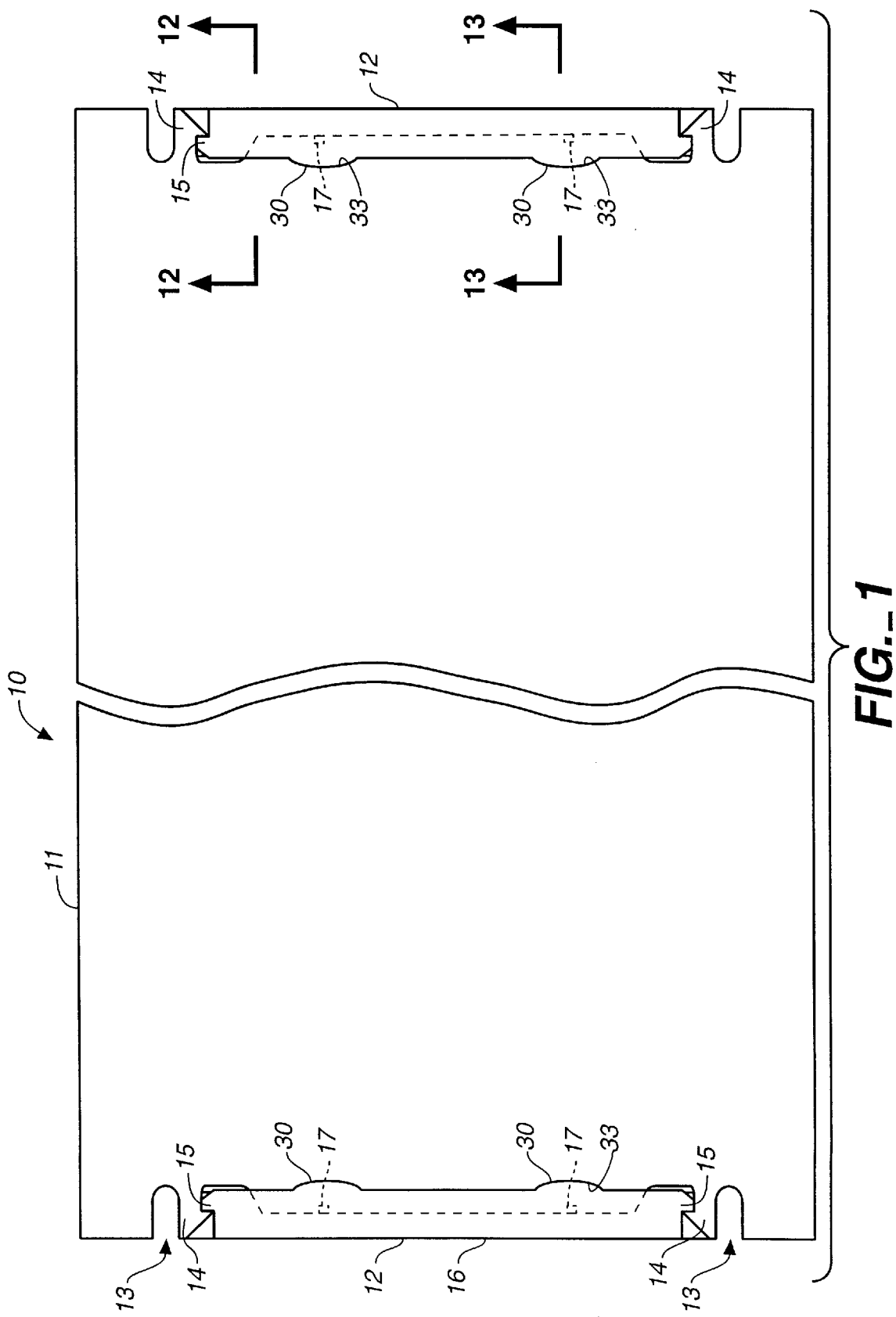

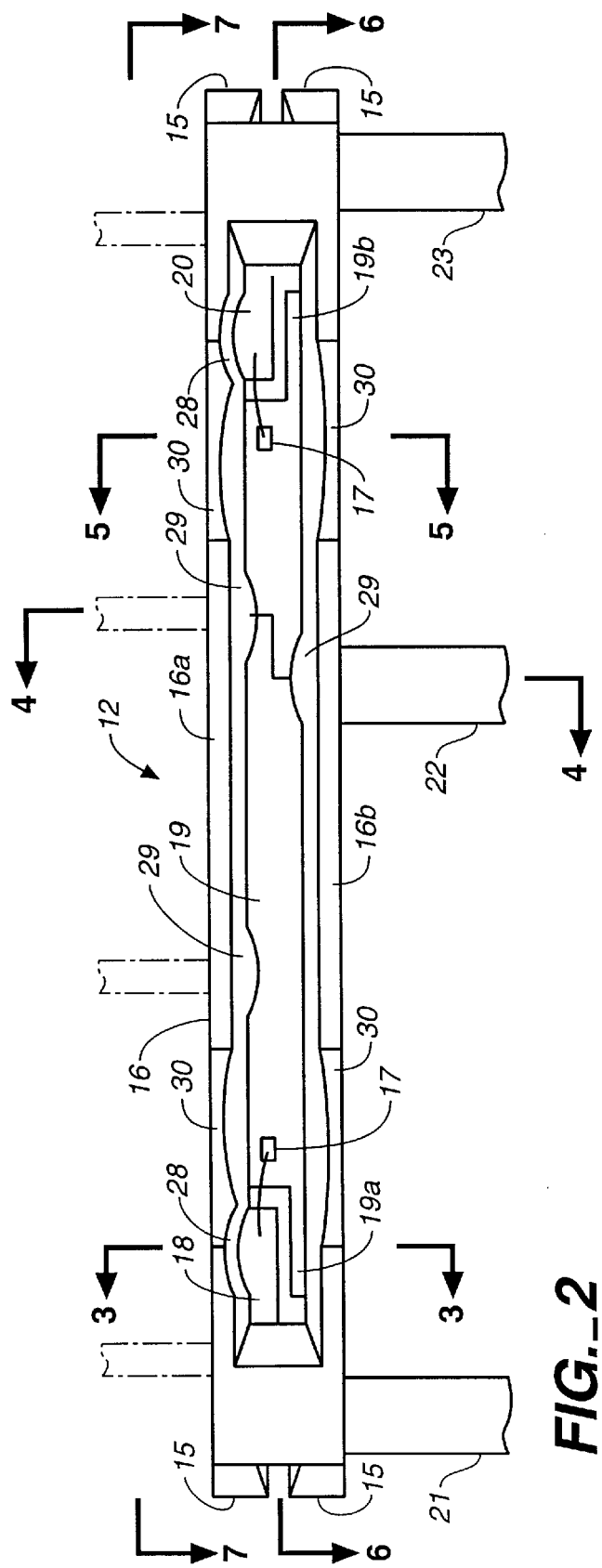
FIG._2

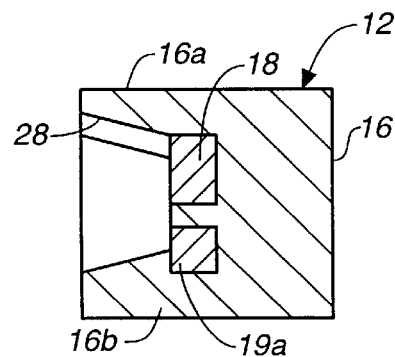
FIG._3
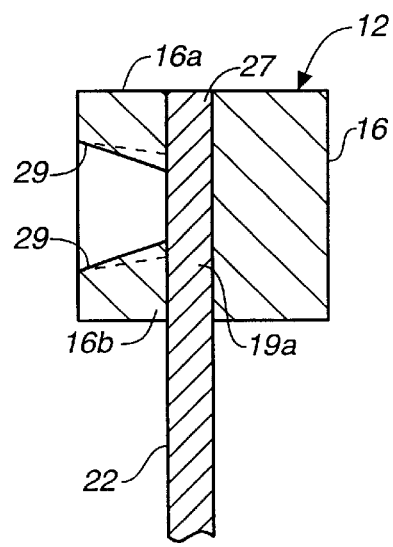
FIG._4
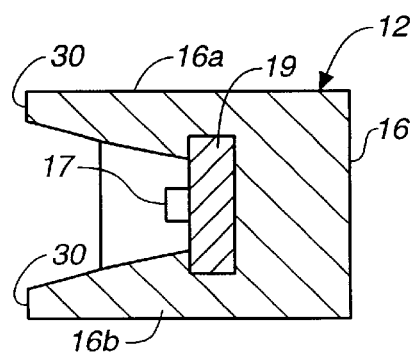
FIG._5

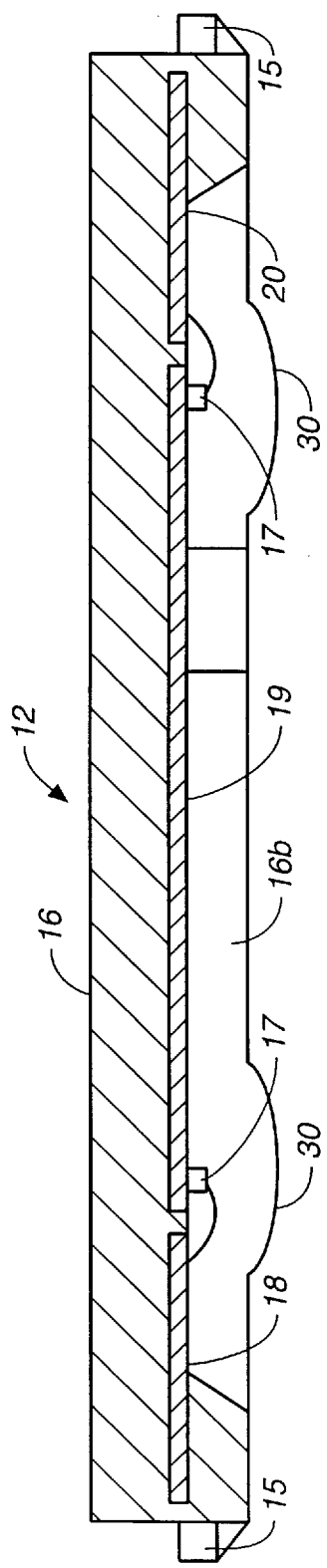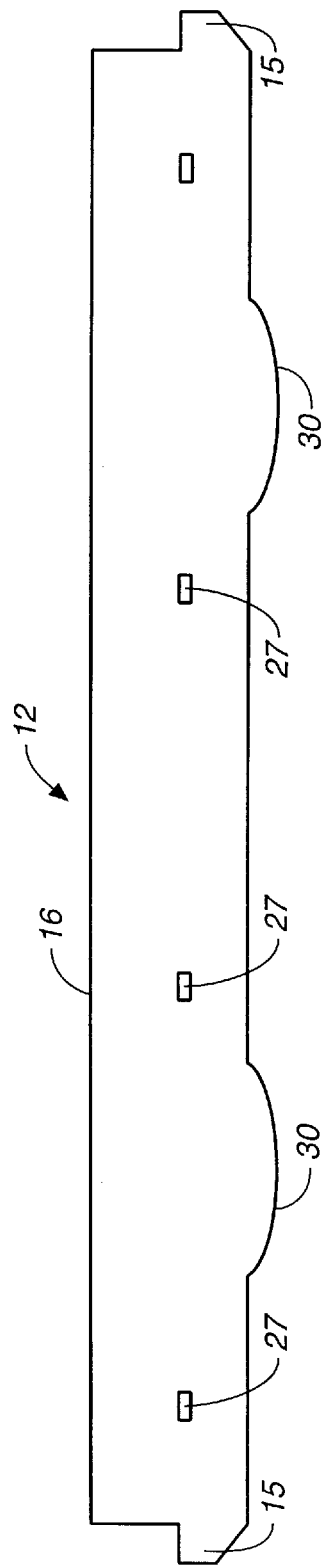

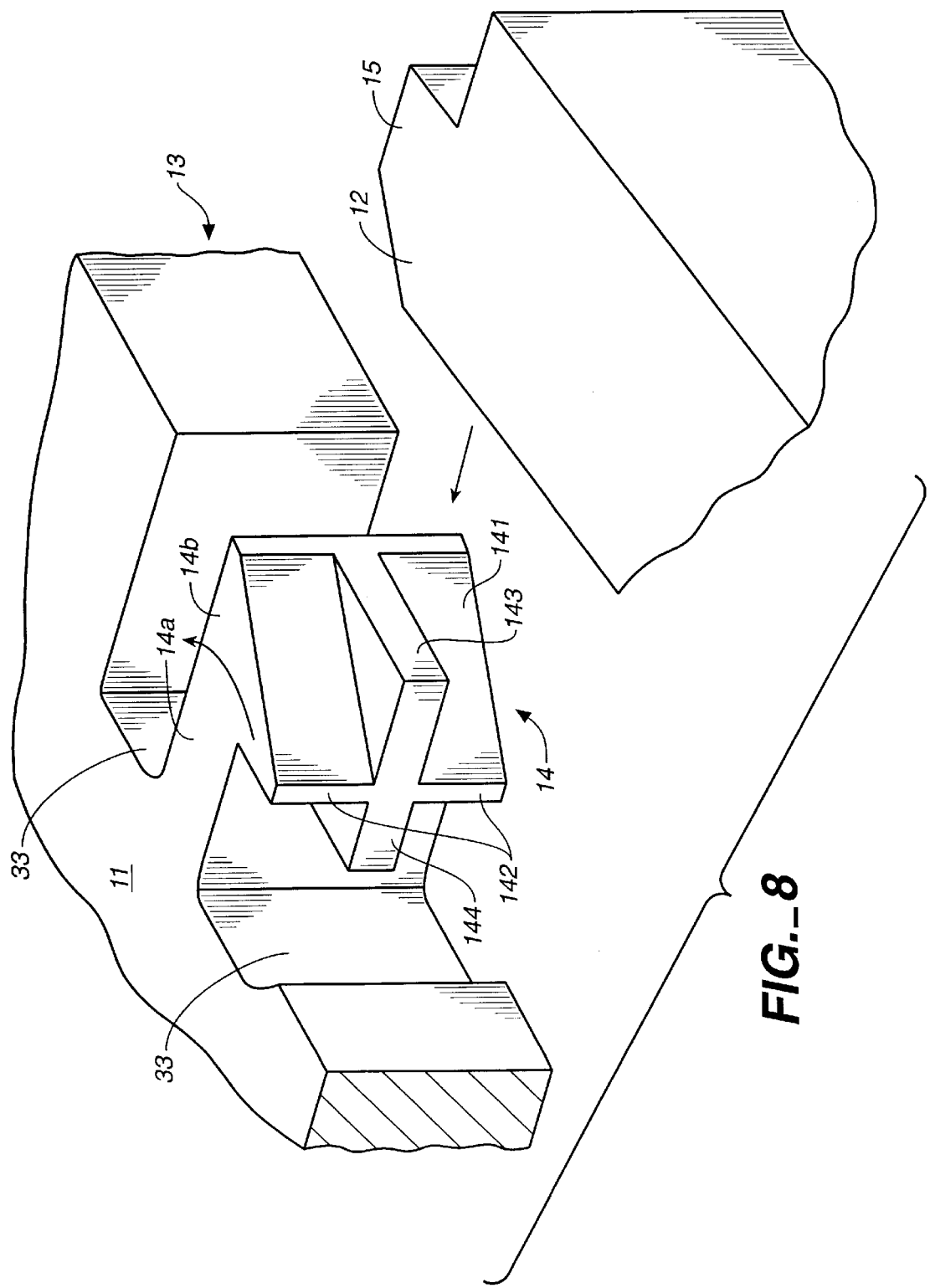
FIG._8

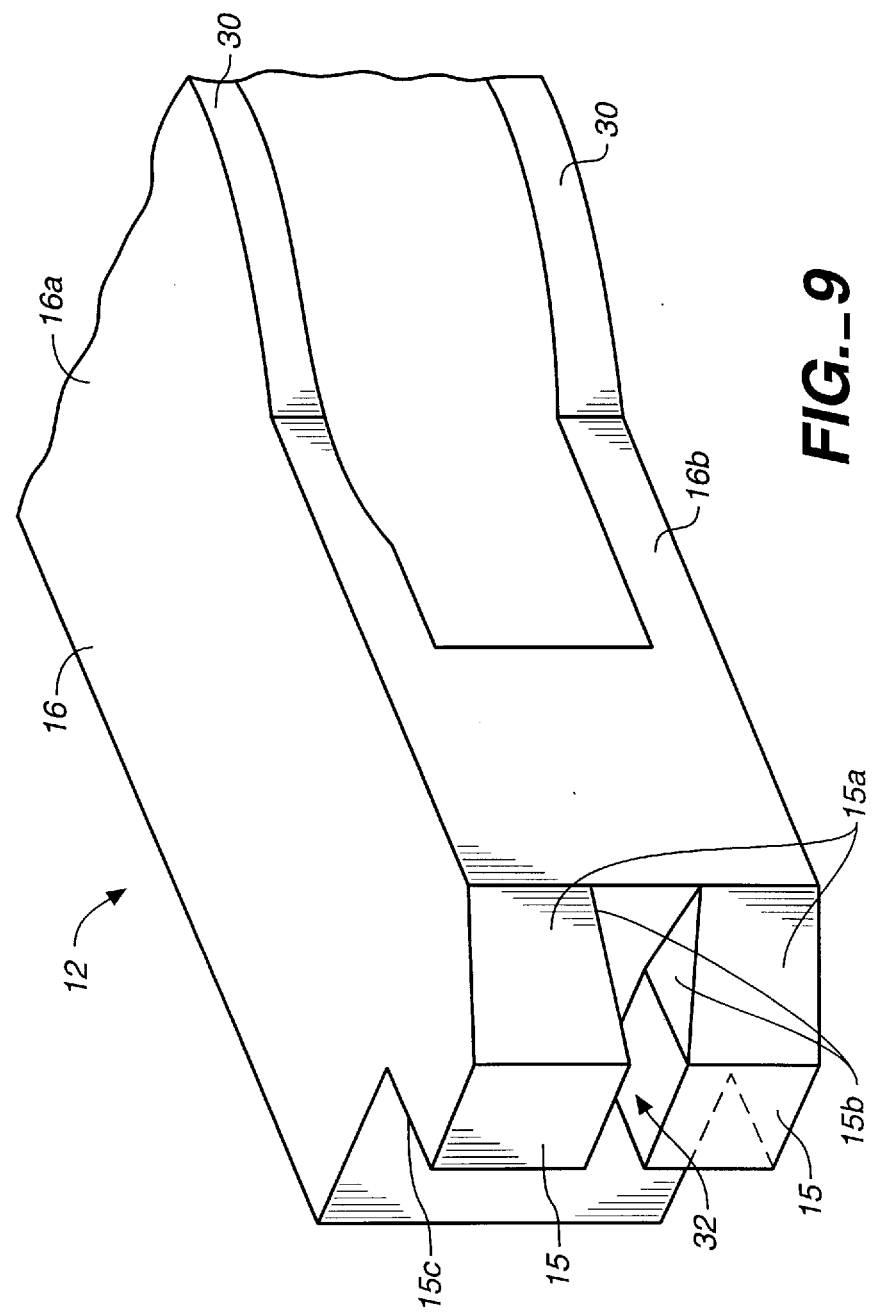
FIG._9

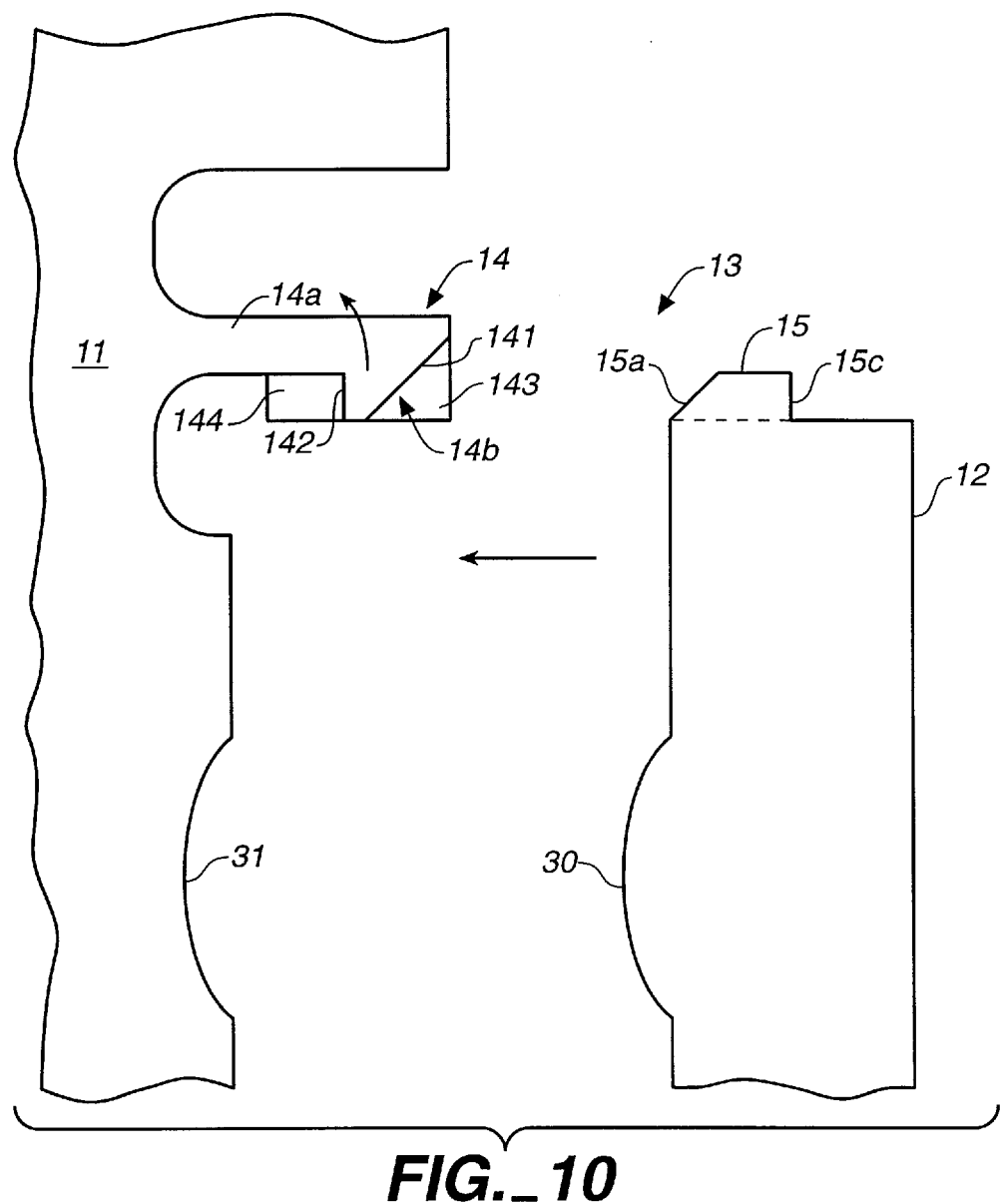
FIG._10

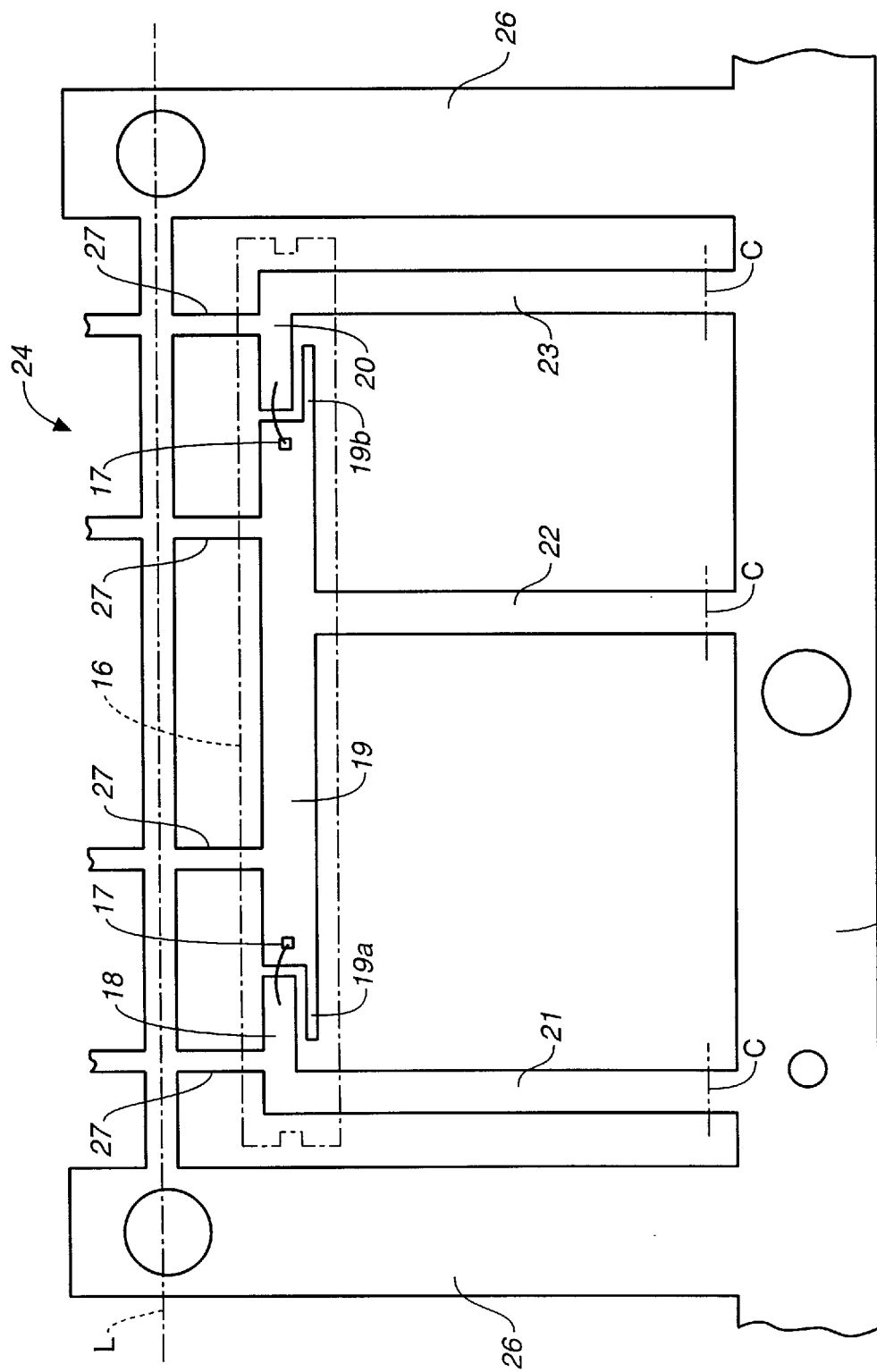
FIG._11

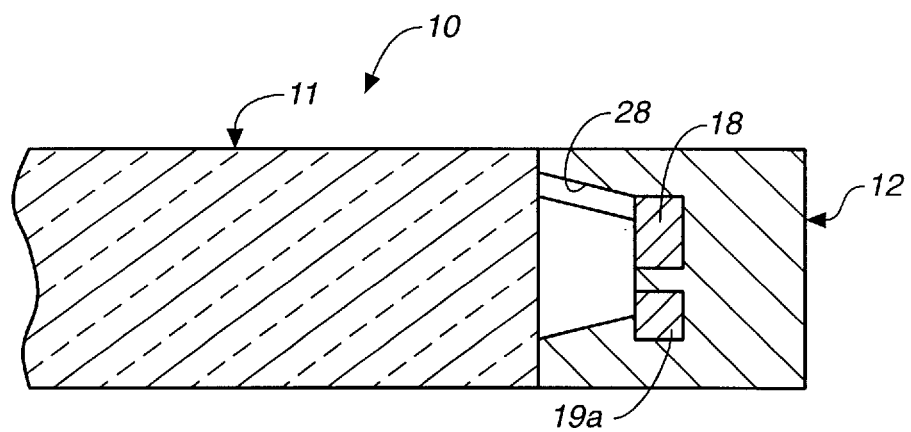
FIG._12
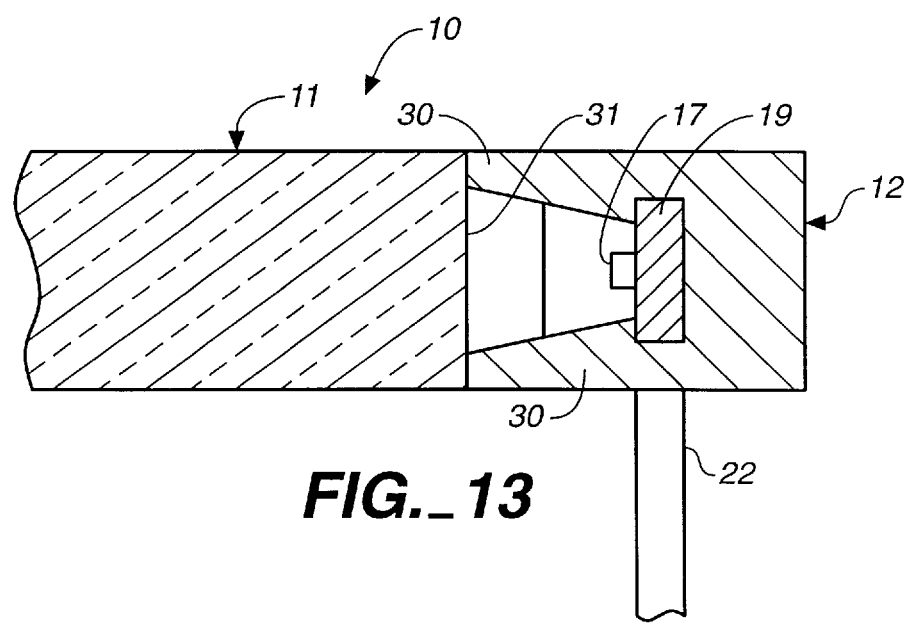
FIG._13

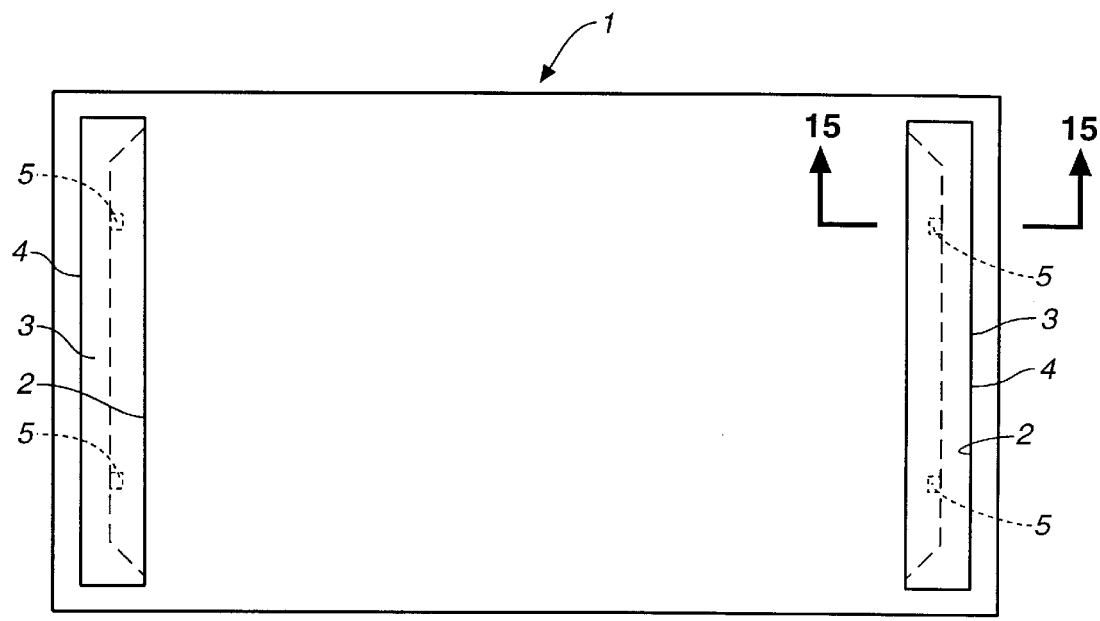
FIG._14
*(PRIOR ART)*
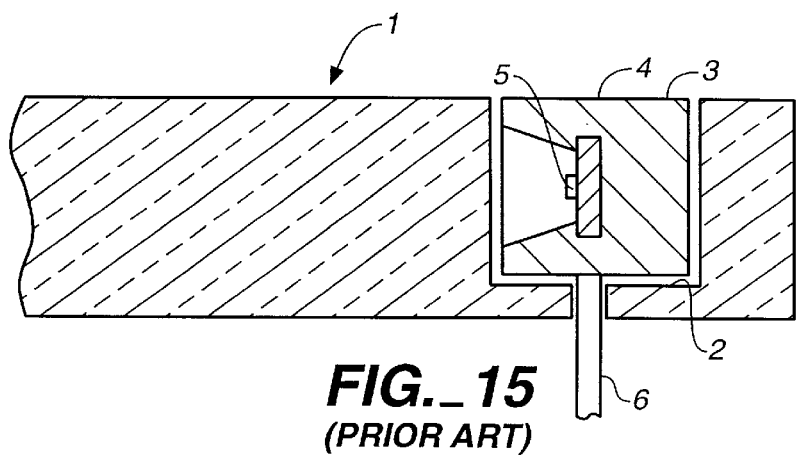
FIG._15
*(PRIOR ART)*

LIGHT SOURCE DEVICE AND METHOD OF PRODUCING SAME

BACKGROUND OF THE INVENTION

This invention relates to a light source device using LEDs and, more particularly, to such a light source device for an illuminator of the so-called back lighting type such as a liquid crystal panel display device which does not emit light itself but is illuminated from behind so as to improve the visibility of a light-emitting surface.

Japanese Utility Model Publication Jikkai 4-14943 disclosed an example of such an illuminator, as shown in FIGS. 14 and 15, having indentations 2 formed at peripheral parts on the upper surface of a transparent or translucent light-conducting plate 1 with a uniform thickness and a light source device 3 using LEDs inserted in each of these indentations 2. Each of these light source devices 3 is formed by providing LED chips 5 to the bottom part of a box-shaped reflector case 4 with an open front surface, filling the interior of the case with a transparent resin material, and providing lead terminals 6 protruding downward from the bottom surface of the reflector case 4. The light beams emitted from each light source device 3 is reflected by the inner surfaces of the reflector case 4, transmitted to the interior of the light-conducting plate 1, reaching every part of the light-conducting plate 1 by repeating total reflections at both its top and bottom surfaces, and eventually emitted out from its surface. As a result, although the light-conducting plate 1 has an extended surface area and the light source devices 3 occupy only a small portion of this area, it seems as if the entire surface of the light-conducting plate 1 is shining.

Light source devices, as described above in the aforementioned reference, are produced from a lead frame having terminal plates on which LED chips are to be arranged as well as lead terminals extended from these terminal plates. Reflective cases 4 are formed on such a lead frame by a resin molding method, LED chips are bonded on the terminal plates inside the these cases, wire bonding is also carried out, and, if necessary, the interior of the reflective cases 4 is filled with a transparent resin material. Finally, the tips of the lead terminals are cut off and the support frames connecting the terminal plates with the lead frame are cut off such that the products can be separated from the lead frame. The lead terminals may be bent as the light source devices thus produced are finally separated from the lead frame.

The height of these reflective cases 4 is only about 1–2 mm because the light source device 3 as a whole must be contained within the thickness of the light-conducting plate 1. Because of this small size, the terminal plates and the lead terminals are likely to become separated from the resin material of the reflective case 4 due to external forces exerted thereon when the support frames and the lead terminals are cut of the lead terminals are reformed after the chip bonding and wire bonding processes are done and the light source devices are separated from the lead frame.

SUMMARY OF THE INVENTION

The present invention was achieved in view of the situations as described above, and it is an object of this invention to provide a light source device using LEDs which can prevent the separation of its lead terminals from its reflective case made of a resin when the lead terminals are cut and reformed during the course of its production.

Another object of this invention is to provide a method of producing such light source devices using LEDs.

A light source device embodying this invention, with which the above and other objects can be accomplished, may be characterized as comprising an elongated rectangular boxed-shaped reflective case with a bottom wall, frame walls which protrude forward from this bottom wall and an open front surface. A plurality of terminal plates are disposed on the bottom part of this reflective case, and a specified number of LED chips are bonded onto these terminal plates. There are also lead members which extend from the terminal plates and reach the outer surface of the frame walls. Thickened parts with increased thickness are further provided on the inner surface of the frame wall at positions corresponding to these lead terminals. What are herein referred to as the lead members may be parts of the lead terminals which extend outward from the outer surface of the reflective case or support lead lines which are cut off along the outer surface of the frame walls of the reflective case.

These thickened parts are stronger because of their increased thickness and can withstand a stronger shearing force exerted through the lead terminals or the support lead lines when these terminals and lines are cut or bent. Thus, the possibility of separation between these lead terminals or the support lead lines from the resin material of the reflective case can be significantly reduced.

A light source device as described above may be produced from a lead frame containing these terminal plates and lead terminals which are integral with and extend from selected ones of these terminal plates. The reflective case as described above is formed by resin molding on the lead frame

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1 is a plan view of an illuminator with a light-emitting surface using light source devices embodying this invention;

FIG. 2 is a front view of a light source device used in the illuminator of FIG. 1;

FIG. 3 is an enlarged sectional view taken along line 3—3 in FIG. 2;

FIG. 4 is an enlarged sectional view taken along line 4—4 in FIG. 2;

FIG. 5 is an enlarged sectional view taken along line 5—5 in FIG. 2;

FIG. 6 is a sectional view taken along line 6—6 in FIG. 2;

FIG. 7 is a view taken along line 7—7 in FIG. 2;

FIG. 8 is a diagonal view of a hook;

FIG. 9 is a diagonal view of engagement protrusions corresponding to the hook shown in FIG. 8;

FIG. 10 is a side view of a hook and a corresponding engagement protrusion for showing their relative positions;

FIG. 11 is a plan view of a portion of a lead frame for the production of the light source device shown in FIGS. 2–7;

FIG. 12 is an enlarged sectional view taken along line 12—12 in FIG. 1;

FIG. 13 is an enlarged sectional view taken along line 13—13 in FIG. 1;

FIG. 14 is a plan view of a prior art illuminator with a light-emitting surface; and FIG. 15 is an enlarged sectional view taken along line 15—15 in FIG. 14.

DETAILED DESCRIPTION OF THE INVENTION

FIGS. 1–13 are referenced next to describe a light source device 12 using LEDs and a method of its production. FIG. 1 is a plan view of an illuminator 10 with a light-emitting surface incorporating light source device 12 according to a preferred embodiment of this invention. As shown in FIG. 1, this illuminator 10 comprises a rectangular light-conducting plate 11 made of a transparent or translucent resin material and light source devices 12 attached to this light-conducting plate 11 directly along its mutually opposite shorter side edges. To be more precise, these light source devices 12 are directly on these side edges and, as will be explained below more in detail, they are adapted to become engaged and held on the side surfaces of the light-conducting plate 11 automatically by engaging means 13 when they are pushed in the direction of the side surfaces of the light-conducting plate 11. The aforementioned engaging means 13 for engaging and holding the light source device 12 to the light-conducting plate 11 comprises hooks 14 which are formed on the light-conducting plate 11 and engagement protrusions 15 formed at both end parts of the light source device 12.

As shown in FIGS. 2–7, the light source device 12 is generally structured similarly to prior art light source devices of a similar kind, having a horizontally elongated rectangular box-shaped reflector case 16 with a bottom part (not in the sense of being at the lowest position but in the sense of being at the deepest part of this box-like shape) and frame walls 16a and 16b extended in the forward direction from this bottom part to form an open front surface, and having LED chips 17 disposed on this bottom part. The reflector case 16 has a height which is approximately the same as the thickness of the light-conducting plate 11, and its length may be determined appropriately in view of the length of the shorter side edge of the rectangular light-conducting plate 11.

Three (the first, second and third) terminal plates 18, 19 and 20 are disposed on the bottom part of the reflective case 16. A first lead terminal 21, a second lead terminal 22 and a third lead terminal 23 extend downward respectively from the first, second and third terminal plates 18, 19 and 20.

FIG. 11 shows a lead frame 24 which may be used for producing the light source device 12 as described above, having the three terminal plates 18, 19 and 20 and the lead terminals 21, 22 and 23 connected to a side frame 25 and cross frames 26 through support leads 27. FIG. 11 shows only one unit portion of the lead frame 24 for the production of one light source device 12. Many such units are longitudinally connected, mutually separated by the cross frames 26, and arranged in two rows, symmetrically with respect to the line L. Protrusions 19a and 19b are formed integrally at both ends of the second terminal plate 19, extending overlapped in the vertical direction by and under the first and third terminal plates 18 and 20, respectively. The LED chips 17 are bonded onto the second terminal plate 19 at its both end parts, and upper-surface electrodes on the LED chips 17 are each connected by wire bonding to the first terminal plate 18 or the third terminal plate 20. In other words, the two LED chips 17 of this light source device 12 are electrically connected in parallel.

The reflector case 16 is formed by molding in the region indicated by broken line in FIG. 11. After the bonding and wire bonding steps are carried out, as described above, the interior of the case may be filled with a transparent resin or a resin material mixed with a dispersant. Thereafter, parts of the lead frame, and in particular the parts forming the lead terminals are solder-plated, and the support leads 27 are cut along the outer surface of the reflective case 16. The lead terminals 21, 22 and 23 are cut along lines C.

The aforementioned protrusions 19a and 19b serve to disperse and absorb the shearing strain to which the light source device 12 is subjected through the lead terminals 21, 22 and 23 when it is inserted into the light-conducting plate 11, thereby effectively preventing the generation of cracks between the terminal plates 18, 19 and 20 and the resin material forming the reflective case 16.

Because of the dimensional limitations in the vertical direction (the direction of the width) of the terminal plates 18, 19 and 20, the bonding wires extending from the LED chips 17 must be bonded to positions which are above the center horizontal line of the second terminal plate 19. In order to make it possible to use a prior art capillary for such bonding ("the second bonding"), upward indentations 28 are formed from the inside on the upper wall 16a of the reflective case, as shown in FIGS. 2 and 3, where the second bonding is carried out. Since the reflective case 16 is produced by resin molding, as explained above, such indentations can be provided easily by effecting only small changes in the mold.

As shown in FIG. 11, the lead frame 24 is so designed that the three lead terminals 21, 22 and 23 and the support leads 27 extend from the terminal plates 18, 19 and 20 in mutually opposite directions. As a result, when the lead terminals 21, 22 and 23 are solder-coated, say, by a solder dip method, after the LED chips are bonded and the interior space of the reflective case is filled with a resin, the heat from the molten solder can be effectively dissipated through the support leads 27, thereby preventing separation of the lead terminals 21, 22 and 23 from the reflective case 16 due to thermal strain.

As explained above, the support leads 27 are eventually cut off along the outer surface of the reflective case 16 and the lead terminals 21, 22 and 23 are cut off along lines C shown in FIG. 11. If necessary, the lead terminals 21, 22 and 23 may be bent at specified positions in a so-called lead-forming process. In order to prevent the separation of the terminal plate 18, 19 and 20 from the resin material of the reflective case 16 due to external forced during such lead-cutting and lead-forming processes, reinforcing thickened parts 29 are also provided as shown in FIGS. 2 and 4 on the inner surfaces of the upper wall 16a and the lower wall 16b of the reflective case 16 at positions corresponding to the support leads 27.

In short, the light source device 12 according to this invention is characterized as having portions of the upper and lower frame walls 16a and 16b of the reflective case 16 made thicker at positions where the support leads 27 still remain in the reflective case 16. Thus, these leads 27, remaining inserted into the resin material of the reflective case 16 are more securely supported. This serves to significantly reduce the possibility of occurrence of separations of the lead terminals and support leads from the reflective case as well as cracks in the reflective case due to the shearing force applied to the support leads at the time of lead-cutting and lead-reforming processes. As a result, the production yield and production efficiency of these light source devices are significantly improved.

Since these thickened parts 29 are formed on the inner surface of the frame walls 16a and 16b of the reflective case 16, they do not affect the external size of the reflective case 16. These thickened parts 29, too, can be provided easily by effecting only small changes in the mold for the production of the reflective case 16 without making the production processes more complicated.

As shown in FIGS. 2, 5, 6 and 13, furthermore, the forward protrusions 30 of the box-shaped reflective case 16 are further extended forward in a semicircular form where the LED chips 17 are provided. The opposite side surface of the light-conducting plate 11 is correspondingly provided with indentations 31 such that, when the light source device 12 is inserted into the light-conducting plate 11, the light emitted from the LED chips 17 will be prevented from directly leaking out from the surface of the light-conducting plate 11 near the LED chips 17. This prevents the areas around the LED chips 17 from becoming more strongly illuminated.

On each end of the light source device 12, or on each end part of the reflective case 16, engagement protrusions 15 are integrally formed, as shown in FIGS. 8, 9 and 10 as parts of an engaging means 13, collaborating with the hook 14 formed on the side surface of the light-conducting plate 11 for automatically engaging the light source device 12 with the light-conducting plate 11 by merely pushing the light source device 12 against the side surface of the light-conducting plate 11.

As shown in FIG. 9, two protrusions 15 are formed at each end part of the reflective case 16, one above the other with a gap 32 of a specified width in between. These protrusions 15 are formed on the frontal (towards the light-conducting plate 11) part of the side surface from its center and a slope 15a is formed on the front side of each. The mutually opposite surfaces of the two protrusions 15 (facing the gap 32) include sloped parts 15b such that their separation increases towards the front.

Each of the hooks 14, formed on a side surface of the light-conducting plate 11, as best shown in FIG. 8, comprises an axis part 14a which is elastically deformable and flexible in the direction of the arrow and a hooking part 14b formed at the tip of the axis part 14a, having a sloped guide surface 141 and an engagement surface 142, a guide wall 143 of a specified thickness protruding horizontally from the middle (in the vertical direction) of the sloped guide surface 141 and a backward protruding wall 144 of a specified thickness protruding similarly but towards the base of the hook 14. The thickness of the guide wall 143 and the backward protruding wall 144 is determined according to the width of the gap 32 between the aforementioned two engagement protrusions 15 formed on the reflector case 16.

As the light source device 12 thus formed is pushed against one of the side surfaces of the light-conducting plate 11, as shown in FIG. 10, the slopes 15a on the engagement protrusions 15 on the reflective case 16 are pressed against the sloped guide surfaces 141 of the hooking part 14b of the hook 14. This causes the hook 14 to elastically flex as shown by the arrow in FIG. 8, and the engagement surface 142 of the hook 14 is automatically engaged to the back 15c of the protrusions 15. Since the gap 32 between the upper and lower protrusions 15 is wider towards the front, the guide wall 143 of the hook 14 can be easily received thereinto and guided therethrough. The backward protruding wall 144 on the hook 14 is so designed as to fit exactly in the gap 32 when the hook 14 engages with the engagement protrusions 15 as shown in FIG. 1. With the engagement surface 142 of the hook 14 and the back surfaces 15c of the protrusions 15 on the reflective case 16 properly designed, the front of the light source device 12 matches exactly with side surface of the light-conducting plate 11 without leaving any unwanted gap therebetween.

As shown in FIGS. 8 and 9, an indentation 33 is formed by the axis part 14a of the hook 14 so as to increase the effective length of the axis part 14a and to make it easier to flex elastically in the direction of the arrow.

Once engaged, the light source device 12 does not fall off easily from the light-conducting plate 11 because of the engagement between the engagement surface 142 of the hook 14 and the back surfaces 15c of the engagement protrusions 15. The engagement of the backward protruding wall 144 inside the gap 32 between the two engagement protrusions 15 prevents a vertical displacement of the light source device 12 with respect to the light-conducting plate 11 as well as its twisting motion.

The example illustrated above is not intended to limit the scope of the invention. Many modifications and variations are possible within the scope of the invention. This invention relates most significantly to providing thickened parts on the inner surface of the frame walls of the reflective case of a light source device using LEDs such that positions where supporting leads remain inserted to the resin material of the reflective case can be reinforced and the separations of the support leads and the lead terminals from the resin material of the reflective case and cracks in the resin material can be prevented. Thus, the scope of the invention is not limited by the external shape of the reflective case, the number and arrangements of the terminal plates disposed therein and such other features as illustrated in the specification. All such modifications and variations that may be apparent to a person skilled in the art are intended to be within the scope of this invention.

What is claimed is:

1. A light source device comprising:
    an elongated rectangular box-shaped reflective case having a bottom part and frame walls which protrude forward from said bottom part to thereby form an open front surface;
    a plurality of terminal plates disposed on said bottom parts;
    a specified number of LED chips bonded to said terminal plates; and
    lead lines which extend from said terminal plates and penetrate said reflective case, inner surfaces of said frame walls having thickened parts with increased thickness at positions corresponding to said lead lines.

2. The light source device of claim 1 wherein said lead lines are parts of longer lead terminals which extend externally from an outer surface of one of said frame walls.

3. The light source device of claim 1 wherein said lead lines have been cut at an outer surface of said frame walls.

4. A method of producing a light source device, said method comprising the steps of:
    providing a lead frame containing a plurality of terminal plates, lead terminals which are integral with and extend from selected ones of said terminal plates and support lead lines which are integral with and extend from one or more of said terminal plates; and
    forming on said lead frame an elongated rectangular box-shaped reflective case having a bottom part and frame walls which protrude in a forward direction from said bottom part to thereby provide an open front surface such that said plurality of terminal plates are on said bottom part and said lead terminals penetrate one of said frame walls and extend further outward therefrom, inner surfaces of said frame walls having thickened parts with increased thickness at positions corresponding to said lead terminals.

5. The method of claim 4 wherein said lead terminals extend in one direction from said terminal plates and at least one of said support lead lines extends in opposite direction from said terminal plates.

6. The method of claim 4 wherein said reflective case is formed by resin molding.

7. A method of producing a light source device, said method comprising the steps of:

providing a lead frame containing a plurality of terminal plates, lead terminals which are integral with and extend from selected ones of said terminal plates and support lead lines which are integral with and extend from one or more of said terminal plates; and forming on said lead frame an elongated rectangular box-shaped reflective case having a bottom part and frame walls which protrude in a forward direction from said bottom part to thereby provide an open front surface such that said plurality of terminal plates are on said bottom part and said support lead lines each penetrate one of said frame walls and extend further outward therefrom, inner surfaces of said frame walls having thickened parts with increased thickness at positions corresponding to said support lead lines.

8. The method of claim 7 wherein said lead terminals extend in one direction from said terminal plates and at least one of said support lead lines extends in opposite direction from said terminal plates.

9. The method of claim 7 wherein said reflective case is formed by resin molding.

* * * * *